United States Patent [19]

Verkuil

[11] Patent Number: 5,442,297
[45] Date of Patent: Aug. 15, 1995

[54] CONTACTLESS SHEET RESISTANCE MEASUREMENT METHOD AND APPARATUS

[75] Inventor: Roger L. Verkuil, Wappingers Falls, N.Y.

[73] Assignee: International Business Machines Corporation, Armonk, N.Y.

[21] Appl. No.: 269,855

[22] Filed: Jun. 30, 1994

[51] Int. Cl.⁶ .................. G01N 27/22; G01R 27/00; G01R 31/26; G01R 31/308
[52] U.S. Cl. ............................. 324/702; 324/659; 324/683; 324/686; 324/693; 324/709; 324/719; 324/752; 324/766; 324/96
[58] Field of Search .............. 324/659, 679, 683, 686, 324/690, 693, 697, 702, 705, 709, 719, 501, 750, 752, 765, 766, 767, 96

[56] References Cited

U.S. PATENT DOCUMENTS

| | | | |
|---|---|---|---|
| 2,811,691 | 10/1957 | Dahm et al. | 324/722 |
| 3,206,674 | 9/1965 | Thuy et al. | 324/765 |
| 3,748,579 | 7/1973 | Henry et al. | 324/702 X |
| 4,456,879 | 6/1984 | Kleinknecht | 324/767 |
| 4,464,627 | 8/1984 | Munakata et al. | 324/765 |
| 4,563,642 | 1/1986 | Munakata et al. | 324/752 |
| 4,812,756 | 3/1989 | Curtis et al. | 324/750 |
| 4,816,755 | 3/1989 | Look et al. | 324/702 X |
| 4,827,212 | 5/1989 | Kamieniecki | 324/765 |
| 4,908,568 | 3/1990 | Soelkner | 324/96 |
| 4,922,182 | 5/1990 | Cox | 324/682 |
| 5,025,145 | 6/1991 | Lagowski | 324/767 X |
| 5,083,090 | 1/1992 | Sapsford et al. | 324/632 |
| 5,091,691 | 2/1992 | Kamieniecki et al. | 324/765 |
| 5,140,272 | 8/1992 | Nishimatsu et al. | 324/662 |
| 5,142,224 | 8/1992 | Smith et al. | 324/765 |
| 5,216,362 | 6/1993 | Verkuil | 324/767 |

FOREIGN PATENT DOCUMENTS 0319301 1/1991 Japan .................. H01C 17/06

OTHER PUBLICATIONS

S. C. Jain et al., "Physics of Semiconductor Devices: Proceedings of the International Workshop", Nov. 1981, New Delhi, India, pp. 290–303.

Primary Examiner—Kenneth A. Weider
Assistant Examiner—Glenn W. Brown
Attorney, Agent, or Firm—Michael J. Balconi-Lamica; Susan M. Murray

[57] ABSTRACT

A contactless sheet resistance measurement apparatus and a method for measuring the sheet resistance of a desired layer of a first conductivity type, formed upon a substrate of an opposite conductivity type, is disclosed. The apparatus comprises a junction capacitance establishing means, a point location alternating current AC photovoltage generating means for generating a laterally propagated AC photovoltage, an attenuation and phase shift monitoring means for monitoring the laterally propagated AC photovoltage, and a sheet resistance signal generating means responsive to the junction capacitance establishing means, the AC photovoltage generating means, and the attenuation and phase shift monitoring means for generating an output signal indicative of a sheet resistance $R_S$ of the desired layer according to a prescribed sheet resistance model.

36 Claims, 6 Drawing Sheets

CONTACTLESS SHEET RESISTANCE MEASUREMENT METHOD AND APPARATUS

BACKGROUND OF THE INVENTION

1. Field of the Invention

The present invention generally relates to the field of semiconductor wafer testing, and more particularly, to a non-contact method and apparatus for testing such wafers.

2. Discussion of the Related Art

There are a variety of important measurements that must be made on a semiconductor wafer to determine whether it is suitable for further device processing and to make process adjustments. Examples of such measurements include doping concentration measurements, charge time retention measurements, and general leakage measurements. However, present measurement techniques have repeatability problems, and those techniques that utilize metal-oxide-semiconductor (MOS) structures to make the measurements destroy the wafer under test.

Advances in semiconductor technology place new requirements upon electrical characteristic measurement equipment and associated measurement capabilities, for instance, a requirement to monitor epi and ion implant sheet resistance, $R_S$, in a high $R_S$ range, on the order of greater than 500 ohms/square. Current known measurement apparatus and techniques include probing technology through the use of mechanical probes, such as, well known 4 point probe techniques. Probing technology has limitations, however, due to probing errors.

For instance, in the measuring of sheet resistance of a low dose, shallow implant layer on a semiconductor wafer, the four-point probe technique is highly prone to errors. For instance, use of mechanical probes greatly increases the probability for a probe to poke through an-implant layer. Probes are generally not able to make an adequate ohmic contact to a highly resistive, low dose, implant layer. Furthermore, probe pressures necessary for making ohmic contact with an implant layer can create P-N junction leakage between the implant layer and an underlying opposite conductivity test wafer. For these and other reasons, the mechanical probing techniques are inadequate for the requirements of advanced semiconductor monitoring needs.

It would thus be desirable to provide an alternative method and apparatus for obtaining "4-point probe-like" measurements. Such an apparatus, and method, should be well suited for providing desired "4-point probe-like" measurements and further having an acceptable repeatability and accuracy of measurements suitable for advanced semiconductor monitoring needs.

SUMMARY OF THE INVENTION

An object of the present invention is to provide a non-contact sheet resistance measurement apparatus and method.

Another object of the present invention is to provide a non-contact sheet resistance measurement apparatus, and method, having an ability to measure sheet resistance of a desired layer with high accuracy, the desired layer comprising a low dose and shallow implant layer.

According to the invention, a contactless sheet resistance measurement apparatus for measuring the sheet resistance of a desired layer of a first conductivity formed upon an underlying opposite conductivity substrate comprises the following. A Junction capacitance establishing means establishes an amount of junction capacitance of the junction between the desired layer and the underlying substrate and further provides a signal indicative of the junction capacitance. A point location alternating current (AC) photovoltage generating means generates a point location alternating current (AC) photovoltage between the desired layer and the underlying substrate, the photovoltage having a sinusoidal magnitude and frequency and further being propagated radially outward from a point location along the desired layer by a resistive nature of the desired layer at an attenuation and phase shift. The point location AC photovoltage generating means further provides a signal indicative of the AC sinusoidal frequency. An attenuation and phase monitoring means monitors the attenuation and phase shift of the propagated AC photovoltage as a function of radial distance remote from the point location. The attenuation and phase shift monitoring means further provides first and second output signals indicative of a first and a second monitored magnitude and phase at first and second radial distances, respectively. Lastly, a sheet resistance signal generating means is responsive to the junction capacitance signal, the AC sinusoidal frequency signal, and the first and second attenuation and phase shift signals for generating an output signal indicative of a sheet resistance $R_S$ of the desired layer according to a prescribed sheet resistance model.

In addition, according to the invention, a contactless sheet resistance measurement method for measuring the sheet resistance of a desired layer of a first conductivity formed upon an underlying opposite conductivity substrate comprises the steps of: a) establishing an amount of junction capacitance of a junction between the desired layer and the underlying substrate and providing a signal indicative of the junction capacitance; b) generating a point location alternating current (AC) photovoltage between the desired layer and the underlying substrate, the photovoltage having a sinusoidal magnitude and frequency and further being propagated radially outward from a point location along the desired layer by a resistive nature of the desired layer at an attenuation and phase shift, and providing a signal indicative of the AC sinusoidal frequency; c) monitoring the attenuation and phase shift of the propagated AC photovoltage as a function of radial distance remote from the point location, and providing first and second output signals indicative of a first and a second monitored magnitude and phase at first and second radial distances, respectively; and d) providing a means responsive to the junction capacitance signal, the AC sinusoidal frequency signal, and the first and second attenuation and phase shift signals for generating an output signal indicative of a sheet resistance $R_S$ of the desired layer according to a prescribed sheet resistance model.

BRIEF DESCRIPTION OF THE DRAWINGS

The foregoing and other teachings of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF THE PREFERRED EMBODIMENTS

Figure 1:
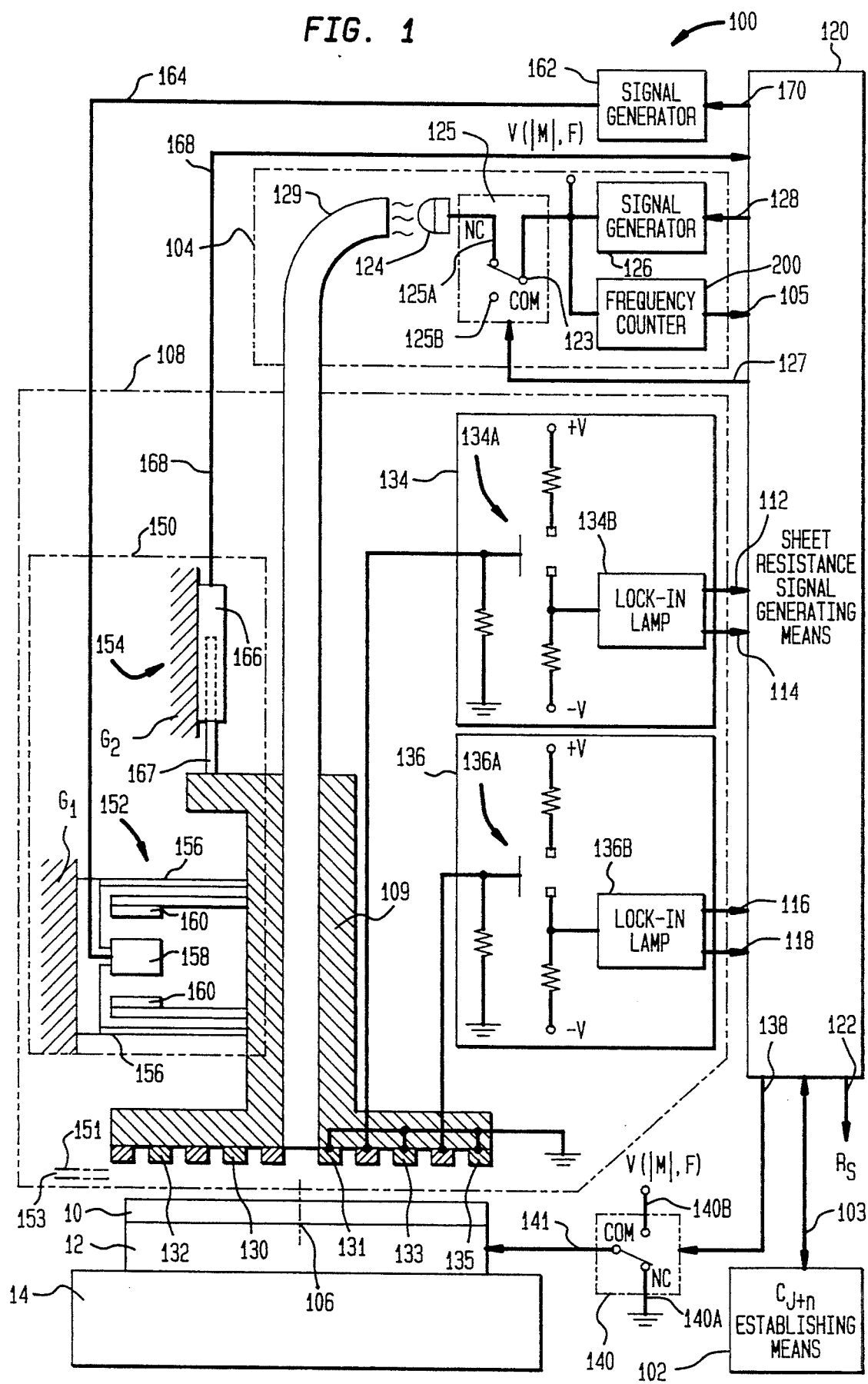
FIG. 1 shows a schematic view, with parts in section, of a contactless sheet resistance measurement apparatus according to the present invention.

Referring now to FIG. 1, a contactless sheet resistance measurement apparatus 100 is shown. Apparatus 100 measures, according to a prescribed sheet resistance model, a sheet resistance ($R_S$) of a desired layer 10 of a first conductivity type formed upon an underlying substrate 12 of an opposite conductivity type. The desired layer 10 may comprise, for example, an ion implant layer, an epi layer, or an inverted silicon surface. In particular, layer 10 may comprise a lightly doped N-type ion implant layer. Substrate 12 may comprise a P-type substrate having a prescribed substrate dopant concentration. A suitable vacuum chuck 14 securably holds substrate 12 in a desired position, vacuum chucks being well known in the art. Semiconductor substrates, ion implant layers, epi layers, and inverted silicon surfaces are also well known in the art, and only briefly discussed herein.

Apparatus 100 comprises a junction capacitance establishing means 102 for establishing an amount of junction capacitance of the junction between the desired layer 10 and the underlying substrate 12. The junction capacitance establishing means 102 provides an output signal indicative of the junction capacitance, for example, via signal line 103.

Junction capacitance establishing means 102 of FIG. 1 may comprise a suitable input device for entering an input representative of a known amount of junction capacitance of the junction between the desired layer 10 and the underlying substrate 12. Such an input device may comprise a keypad or keyboard, for entering known junction capacitance information. In instances where the junction capacitance is not known, junction capacitance establishing means 102 may comprise a means for measuring the junction capacitance of the desired layer and the underlying substrate or, alternatively, an electrical characteristic corresponding to the amount of junction capacitance. For example, such a junction capacitance establishing means may comprise any suitable commercially available resistivity meter, wherein the junction capacitance can be determined as a function of the measured resistivity, using well known methods in the art. That is, assuming a step junction approximation, junction capacitance is a function of doping concentration of the substrate which is a function of resistivity, as taught in references J. C. Irvin, Resistivity of Bulk Silicon and of Diffused Layers in Silicon, Bell System Tech. J., Vol. 41, pp. 387–410, 1962 and B. G. Streetman, Solid State Electronic Devices, pp. 187–191, 1972, incorporated herein by reference. In other words, resistivity can be used to determine doping concentration, from which junction capacitance can be determined.

A point location alternating current (AC) photovoltage generating means 104 (see FIG. 1) is provided. Means 104 generates a point location alternating current photovoltage having a sinusoidal magnitude $|M|$ and modulation frequency F at a point location 106 (indicated in FIG. 1) between the desired layer 10 and the underlying substrate 12. The point location AC photovoltage is propagated radially outward from the point location 106 laterally through the bulk of the desired layer 10 by a resistive nature of the desired layer 10 at a corresponding attenuation and phase shift. Point location AC photovoltage generating means 104 further provides an output signal indicative of the AC sinusoidal modulation frequency F on signal line 105.

Referring again to FIG. 1, the AC point location photovoltage generating means 104 comprises any suitable light source 124, such as a light emitting diode (LED) or a laser device. Light source 124 can further comprise a light source of a wavelength on the order of 0.65 to 0.94 microns. The particular light source 124 is chosen according to the particular requirements of the sheet resistance measurement. For instance, the requirements of a particular sheet resistance measurement may comprise, for instance, minimizing an amount of lateral scattered light and/or achieving a desired point location photovoltage light spot size.

Referring still to FIG. 1, light source 124 is electrically connected to a signal generating means 126 via controllable switching means 125, as shown in a normally closed position in FIG. 1. Controllable switching means 125 can comprise any suitable controllable switch, wherein a common node 123 is switchable between at least two outputs, $125_A$ and $125_B$. As shown in FIG. 1, output $125_A$ is connected to light source 124. Switching means 125 is controlled via a signal received on signal line 127. Light source 124 is energized by signal generating means 126, signal generating means 126 comprising any suitable sinusoidal modulation frequency signal generating means. A suitable frequency counter 200 monitors the output signal $V(|M|,F)$ of signal generating means 126 and provides a feedback signal indicative of modulation frequency F on signal line 105.

Point location photovoltage generating means 104 further comprises an optional light pipe or optical fiber 129 for directing a sinusoidal illumination of the light source 124 to the point location 106. In instances in which no light pipe or optical fiber are used, light source 124 is positioned and focused by suitable means for directing its light output at the desired location and for generating a desired spot size. As shown in FIG. 1, the sinusoidal illumination of the light source 124 is directed by the light pipe 129 to form a localized spot 1250 (see FIG. 2) on a top surface of the desired layer 10. The localized light spot 1250 may comprise a diameter on the order of 2 mm or less.

Referring again to FIG. 1, an attenuation and phase shift monitoring means 108 monitors the attenuation and phase shift of the propagated AC photovoltage as a function of radial distance remote from the point location 106. Attenuation and phase shift monitoring means 108 provides first and second output signals, $V_1(|V_1|, \beta_1)$ and $V_2(|V_2|, \beta_2)$, respectively, indicative of a first and second monitored magnitude $|V|$ and phase $\beta$ at first and second effective radial distances, $r_1$ and $r_2$, respectively. That is, the first output signal, $V_1(|V_1|, \beta_1)$, on signal lines 112 and 114 (see FIG. 1) is indicative of a monitored magnitude $|V_1|$ and phase $\beta_1$, respectively, at a first effective radial distance $r_1$ (see FIG. 2). The second output signal, $V_2(|V_2|, \beta_2)$, on signal lines 116 and 118 (see FIG. 1) is indicative of a monitored magnitude $|V_2|$ and phase $\beta_2$, respectively, at a second effective radial distance $r_2$ (see FIG. 2). Note that, at a minimum, the attenuation and phase shift monitoring means 108, and the desired layer 10 and underlying substrate 12, should be housed within a light-tight enclosure (not shown) to prevent undesirable photo-induced leakage currents during sheet resistance measurements.

Figure 2:
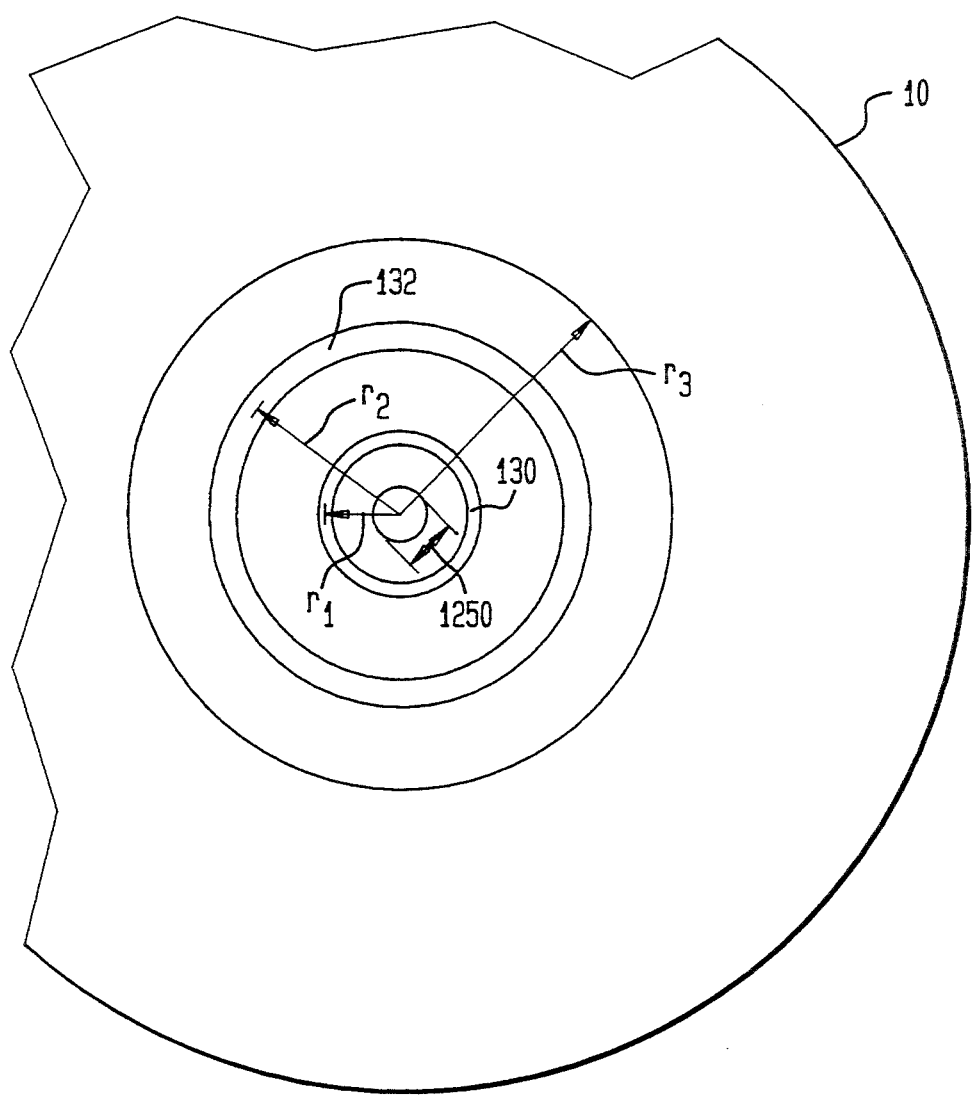
FIG. 2 shows a schematic view of a portion of an attenuation and phase shift monitoring means with respect to a wafer under test, in accordance with the present invention.

Referring now to FIGS. 1 and 2, attenuation and phase shift monitoring means 108 comprises first and second capacitively coupled pick-up plates, 130 and 132, respectively, affixed or mounted to a base member 109 (shown in cross-section in FIG. 1) by suitable means. First and second capacitively coupled pick-up plates, 130 and 132, respectively, are concentric with the localized light spot 125O and the point location 106. Preferably, first and second pick-up plates, 130 and 132, comprise flat conductive metal rings having a first and a second effective radius, $r_1$ and $r_2$, respectively. The second radius $r_2$ comprises a radius larger than the first radius $r_1$, wherein the radii are selected in accordance with a desired voltage characteristic of the prescribed sheet resistance model, as will be explained further below. As shown in FIG. 1, attenuation and phase shift monitoring means 108 further comprises AC voltage sensing means 134 and 136, respectively, for sensing a magnitude and phase of an AC photovoltage capacitively coupled to the first and second pick-up plates 130 and 132, respectively. AC voltage sensing means 134 and 136 preferably comprise ultra high input impedance MOSFET buffers ($134_A$ and $136_A$, respectively) connected to respective lock-in amplifiers ($134_B$ and $136_B$), the MOSFET buffers minimizing loading effects of the inner and outer pick-up plate photovoltage signals, $V_1$ and $V_2$, respectively. Respective lock-in amplifiers $134_B$ and $136_B$ of voltage sensing means 134 and 136 provide corresponding magnitude and phase output signals $V_1(|V_1|, \beta_1)$ and $V_2(|V_2|, \beta_2)$, respectively for each of the first and second pick-up plates 130 and 132, respectively.

Contactless sheet resistance measurement apparatus 100 further includes a positioning means 150 as shown in FIG. 1. The positioning means 150 provides desired vertical positioning or spacing of the attenuation and phase shift monitoring means 108 between a first position 151 and a second position 153. For instance, first position 151 and second position 153 may correspond to a home position and a measurement position, respectively. Precise vertical positioning is important for obtaining a small, repeatable, air gap between the capacitively coupled pick-up plates 130 and 132 and the particular wafer under test. For example, a desired air gap is preferably on the order of 5 mils or less during a sheet resistance measurement. The measurement position 153 thus preferably corresponds to the position at which an air gap distance of 5 mils or less between plates 130 and 132 and the particular wafer or substrate under test is attained. With precise vertical positioning provided by positioning means 150, the capacitive coupling between the capacitively coupled pickup plates 130 and 132 and the wafer under test can be established to a particular value and advantageously maintained. In addition, the effective radii of the capacitively coupled pick-up plates 130 and 132 can also be maintained, the effective radii being a desired fixed value for a particular sheet resistance measurement application, as further explained herein below.

Positioning means 150 preferably comprises an electromechanical forcer 152, in conjunction with an electrical servo system 154, to raise and lower the photovoltage monitoring means 108 in a controlled manner. The electromechanical forcer 152 can comprise a pair of substantially parallel flat steel flexure arms 156, an electromagnet 158, and a pair of fixed permanent magnets 160, all located and positioned in an arrangement such as shown in FIG. 1. For instance, first ends of flexure arms 156 and electromagnet 158 are mechanically connected by suitable means (not shown) to a mechanical ground, $G_1$. Second ends of flexure arms 156 are suitably mechanically connected to base member 109 of photovoltage monitoring means 108. Permanent magnets 160 are rigidly mounted to base member 109. It should be noted that alternate configurations of positioning means 150 may be used.

A signal generator 162 provides a desired signal or signals to electromagnet 158 via signal line 164. Signal generator 162 comprises any suitable controllable signal generator for providing the desired signals as explained herein. Signal generator 162 provides an appropriate signal for energizing electromagnet 158 to either force the fixed magnets 160 up or down, thereby effectively raising or lowering photovoltage monitoring means 108 up or down. In this regard, a prescribed controlled amount of direct (DC) current provided to electromagnet 158 causes flexure arms 156 to flex in a controlled manner to thereby position photovoltage monitoring means 108 in a desired position, while further maintaining voltage pick-up plates 130 and 132 substantially parallel to the surface of the wafer under test. Signal generator 162 further provides an appropriate alternating current AC signal for energizing electromagnet 158 to cause photovoltage monitoring means 108 to vibrate in a controlled manner, to be explained further herein below with respect to operation of the present invention.

Feedback for servo system 154 is provided by a linear variable differential transformer (LVDT) 166, which outputs a position dependent signal on signal line 168. LVDT 166 comprises any suitable linear variable differential transformer. LVDT 166 is mechanically grounded at a mechanical ground $G_2$ by suitable means (not shown) so that plunger 167 of LVDT 166 is in suitable contact with base member 109 of attenuation and phase shift monitoring means 108. Movement of means 108 up or down results in a corresponding movement of plunger 167 up or down, whereby LVDT 166 provides a corresponding position dependent output signal on signal line 168.

Servo system 154 facilitates calibration of positioning means 150, i.e., for establishing prescribed amounts of DC current to be provided by signal generator 162 to electromagnet 158, in conjunction with position dependent output signal information provided on signal line 168, thereby enabling accurate automated control of positioning means 150 for desired positioning of attenuation and phase shift monitoring means 108 (e.g., between the first position 151 and the second position 153, or an alternate position) during operation of sheet resistance measurement apparatus 100. Appropriate calibration of positioning means 150 includes calibration of the positioning of attenuation and phase shift monitoring means 108 with respect to the surface of the desired layer 10 for establishing a desired air-gap therebetween on the order of 5 mils or less, as previously noted. Positioning means 150 may also be responsive to a prescribed change in a calibration attenuation and phase shift for establishing a desired air gap corresponding to the measurement position. Positioning means 150 further advantageously enables means 108 to be placed in a raised position while enabling substrate 12 to be mounted upon vacuum chuck 14 easily, or enables substrate 12 to be positioned under monitoring means 108 without damage to the substrate 12 or to the first and second pick-up plates 130 and 132, respectively.

Sheet resistance measurement apparatus 100 further comprises a sheet resistance $R_S$ signal generating means 120 (See FIG. 1). Sheet resistance $R_S$ signal generating means 120 may comprise for example, a computer and associated interface circuitry, discrete circuitry, or the like, for receiving and providing signals as outlined herein below and for performing prescribed functions. Preferably, sheet resistance generating means 120 comprises a computer and associated interface circuitry, computers and associated interface circuitry being well known in the art and only briefly discussed herein, the computer further being programmed by known techniques for performing desired functions as described herein below also.

Sheet resistance signal generating means 120 is connected to signal line 103 for receiving a Junction capacitance $C_{Jtn}$ signal from junction capacitance establishing means 102. Means 120 is connected to signal line 105 for receiving a signal representative of the AC sinusoidal modulation frequency F of point location AC photovoltage generating means 104. Means 120 provides appropriate control signals to AC photovoltage generating means 104 via signal lines 127 and 128 for controlling controllable switching means 125 and signal generator 126, respectively, in a desired manner as will be explained further herein below with respect to operation of the invention.

Sheet resistance signal generating means 120 is also connected to attenuation and phase shift monitoring means 108, and in particular, to signal lines 112 and 114 of FIG. 1 for receiving magnitude $|V_1|$ and phase $\beta_1$, respectively, of the first output signal, $V_1(|V_1|, \beta_1)$. Furthermore, sheet resistance output signal generating means 120 is connected to signal lines 116 and 118 of FIG. 1 for receiving magnitude $|V_2|$ and phase $\beta_2$, respectively, of the second output signal, $V_2(|V_2|, \beta_2)$.

Sheet resistance signal generating means 120 is further connected to positioning means 150 via appropriate connections, for example, to signal line 168 for receiving position dependent output signal information from LVDT 166. Means 120 further provides an appropriate control signal to positioning means 150 via signal line 170 for controlling controllable signal generator 162 in a desired manner as will be explained further herein below with respect to operation of the invention.

Still further, sheet resistance signal generating means 120 provides an appropriate control signal to a controllable switching means 140 via signal line 138 for controlling controllable switching means 140 in a desired manner as will be explained further herein below with respect to operation of the invention. Controllable switch means 140 can comprise any suitable controllable switch, wherein a common node 141 is switchable between at least two inputs. Preferably, a first input $140_A$ is suitably connected to ground potential and a second input $140_B$ is suitably connected to receive voltage signal $V(|M|,F)$ of sheet resistance signal generating means 100.

In response to the junction capacitance $C_{Jtn}$, the AC sinusoidal frequency F, and the first and second attenuation and phase shift signals $V_1(|V_1|, \beta_1)$ and $V_2(|V_2|, \beta_2)$, respectively, and further in accordance with the prescribed sheet resistance model, sheet resistance signal generating means 120 generates an output signal indicative of a sheet resistance $R_S$ of the desired layer 10. Such an output signal may be provided on an output signal line 122, for example. Similarly, the output signal may likewise be printed out via a printer device (not shown) or displayed upon a display device (not shown).

In conjunction with the present invention and as utilized in accordance with the present invention, the prescribed sheet resistance model will now be described in detail. The prescribed sheet resistance model has been derived based upon considering the desired layer of interest 10 to be a resistive sheet with a distributed P-N junction capacitance between the layer 10 and the underlying opposite conductivity substrate 12. The resistive layer 10 and its associated P-N junction are treated as a small signal alternating-current (AC) distributed resistance-capacitance (R-C) transmission line network. R-C distributed networks are well known in the art and only briefly discussed herein. From a characterization of this R-C distributed network in terms of an AC attenuation and an AC phase shift as a function of distance, in addition to knowing an established junction capacitance, the sheet resistance ($R_S$) of interest is determined. That is, the sheet resistance, $R_S$, (ohms/square) of the desired layer 10 and the junction capacitance, $C_{Jtn}$, (farads/cm$^2$) as well as a leakage conductance, G, (mhos/cm$^2$), between the desired layer 10 and the underlying bulk silicon 12 form a distributed R-C-G circuit. $V_0$ is an AC photovoltage induced by a localized light spot, with sinusoidal modulation frequency, F, variation in illumination intensity. $V_1$ and $V_2$ are the resultant attenuated AC photovoltages at effective radial distances, $r_1$ and $r_2$, respectively, from the center of the light spot. The ratio of attenuated voltages, $V_2/V_1$, is then a function, as expressed by $f(R, C, G, r_1, r_2, F)$, which yields a calculable value for the sheet resistance, $R_S$, of interest. The desired model is thus expressed as:

$$V_2/V_1 = K_0(Kr_2)/K_0(Kr_1),$$

wherein $K_0(Kr)$ is a modified zero order Bessel series of the second kind, and K is a complex number, and r is a radial distance. The function $K_0(Kr)$ can be expressed as:

$$K_0(Kr) = A + jB = |K_0(Kr)| e^{j\beta}.$$

Complex number K can be expressed as:

$$K = E + jF = |K| e^{j\alpha},$$

wherein the value of K is made up characteristic parameters P and g, which are expressed as:

$$g = G/(2\pi FC), \text{ and}$$

$$P = (\pi FRC)^{\frac{1}{2}} \text{ cm}^{-1}.$$

In view of the above, the expression for sheet resistance model $V_2/V_1$ may be rewritten as follows:

$$|V_2/V_1| e^{j\phi} = |K_0(Kr_2)| e^{j\beta_2}/|K_0(Kr_1)| e^{j\beta_1} = f(P, g),$$

wherein P and g are expressed as above, and $$\phi = \beta_2 - \beta_1 \text{ radians.}$$

In connection with the sheet resistance model, suitable values for radial distances $r_1$ and $r_2$ and a small-signal magnitude of $V_2/V_1$ are selected, thereby establishing prescribed boundary conditions. Selection of the specific values for radial distances $r_1$ and $r_2$ and the small-signal magnitude of $V_2/V_1$ is based upon compromises between desired spatial resolution, system noise, measurement accuracy, desired repeatability, etc., according to the particular requirements of the sheet resistance measurement application. For instance, one boundary condition of the sheet resistance model may require attenuation of the photovoltage to zero volts over a prescribed radius, for example, two (2) cm, as shown by radius $r_3$ in FIG. 2. In addition, to achieve a desired small-signal magnitude of $V_2/V_1$, the small-signal magnitude of $V_2/V_1$ is forced during sheet resistance measurements by adjusting the sinusoidal modulation frequency, F, of the light source 124. The small-signal magnitude of $V_2/V_1$ is selected to be on the order of 1 mV or less, to thereby maintain the excitation photovoltage at such a level so that undesired voltage effects upon the substrate during the sheet resistance measurement are substantially reduced or eliminated. The magnitude of $V_2/V_1$ is thereby forced so as to fit prescribed boundary conditions of the sheet resistance model according to the present invention.

Also in conjunction with the above discussion, sheet resistance $R_S$ signal generating means 120 further comprises an adjustment means for adjusting the modulation frequency F to achieve a prescribed change in attenuation monitored by said attenuation and phase shift monitoring means 108 between the first and second radial distances, $r_1$ and $r_2$, respectively. Preferably, sheet resistance signal generating means 120 comprises a means for: i) controlling signal generating means 126 to provide an AC voltage signal at a modulation frequency F (wherein an initial modulation frequency $F=F_{INIT}$ is used to begin this portion of process), thereby exciting light source 124 for creating a point location AC photovoltage between the desired layer 10 and the underlying substrate 12; ii) monitoring a magnitude $|V_1|$ and phase $\beta_1$ at radius $r_1$ and a magnitude $|V_2|$ and phase $\beta_2$ at radius $r_2$; and iii) adjusting the frequency F until the ratio of monitored $|V_1|$ to monitored $|V_2|$ is approximately 4:1 in accordance with the prescribed sheet resistance model to within a prescribed range or tolerance. In this manner, modulation frequency F is adjusted until the monitored voltage $|V_2|$ at radius $r_2$ is approximately one-quarter ($\frac{1}{4}$) of the monitored voltage $|V_1|$ at radius $r_1$. The adjusted frequency F is then used for the subsequent sheet resistance determination of the desired layer 10, as will be further explained herein below. Furthermore, adjustment of the modulation frequency F in the above described manner establishes the spot size 125 and results in the voltage at radius $r_3$ (i.e., a desired boundary condition) being approximately zero volts.

In conjunction with adjustment of modulation frequency F as discussed above, a voltage measurement signal calibration can be performed also. Voltage measurement signal calibration is accomplished via sheet resistance signal generating means 120 such that, at any modulation frequency F, any differential variations in magnitude or phase shift between the outputs of voltage sensing means 134 and 136 may be compensated for, as appropriate. More particularly, for achieving a desired voltage measurement signal calibration, sheet resistance $R_S$ signal generating means 120 is operative via signal line 138 for selectively connecting signal generating means 126 (i.e., signal V(|M|,F)) to substrate 12 via controllable switch means 140 of FIG. 1 during a voltage measurement signal calibration. In other words, controllable switch 140 is controlled via an appropriate signal provided upon signal line 138 for switching the connection of common terminal 141 from $140_A$ to $140_B$. In addition, during voltage measurement signal calibration, sheet resistance $R_S$ signal generating means 120 is operative via signal line 127 for selectively disconnecting signal generating means 126 from light source 24 via controllable switch means 125 of FIG. 1. That is, controllable switch 125 is controlled via an appropriate signal provided upon signal line 127 for switching the connection of common terminal 123 from $125_A$ to $125_B$. During a signal calibration operation, the magnitude and phase output signals on signal lines 112, 114 and 116, 118 corresponding to $V_1$ and $V_2$, respectively, are compared with each other using the output of signal generator 126 as a reference signal, i.e., V(|M|,F). Appropriate adjustments to the gains of the voltage sensing means 134 and 136 may be made or appropriate calibration compensation values corresponding to the particular modulation frequency F may be established and stored for use by sheet resistance signal generating means 120. Signal calibration is preferably performed at each modulation frequency F. Such a voltage signal calibration by means 120 advantageously assists in establishing a desired modulation frequency F for the point location AC photovoltage generating means 104 according to the particular desired layer 10 and underlying substrate 12 being tested.

In continuation of the above discussion with respect to determination of the sheet resistance according to the prescribed sheet resistance model, sheet resistance $R_S$ signal generating means 120 further comprises a means for: i) generating an actual magnitude $|V_1/V_2|_{Actual}$ and phase $\phi_{actual}$ (wherein $\phi_{Actual}=\beta_2-\beta_1$) according to the prescribed sheet resistance model, the sheet resistance model being based upon the propagation of the AC photovoltage as a function of radial distance remote from the point location, the prescribed model further comprising first and second prescribed characteristic parameters P and g, respectively; ii) estimating the first characteristic parameter P and the second characteristic parameter g, the estimated first characteristic parameter $P_{EST}$ and the estimated second characteristic parameter $g_{EST}$ being updatable in a prescribed manner; iii) generating a theoretical magnitude $|V_1/V_2|_{THEO}$ and phase $\phi_{THEO}$ according to the prescribed sheet resistance model, the estimated first characteristic parameter $P_{EST}$, and the estimated second characteristic parameter $g_{EST}$; iv) comparing the theoretical magnitude and phase ($|V_1/V_2|_{THEO}$, $\phi_{THEO}$) to the actual magnitude and phase ($|V_1/V_2|_{Actual}$, $\phi_{Actual}$) and, upon the theoretical magnitude and phase being outside a prescribed range of the actual magnitude and phase, iteratively updating the estimated first and second characteristic parameters and repeating iii) and iv); and v) using a most recent value of the estimated first characteristic parameter $P_{EST}$, the junction capacitance $C_{JTN}$, and the modulation frequency F to determine the sheet resistance $R_S$ in accordance with the prescribed sheet resistance model.

Figure 3:
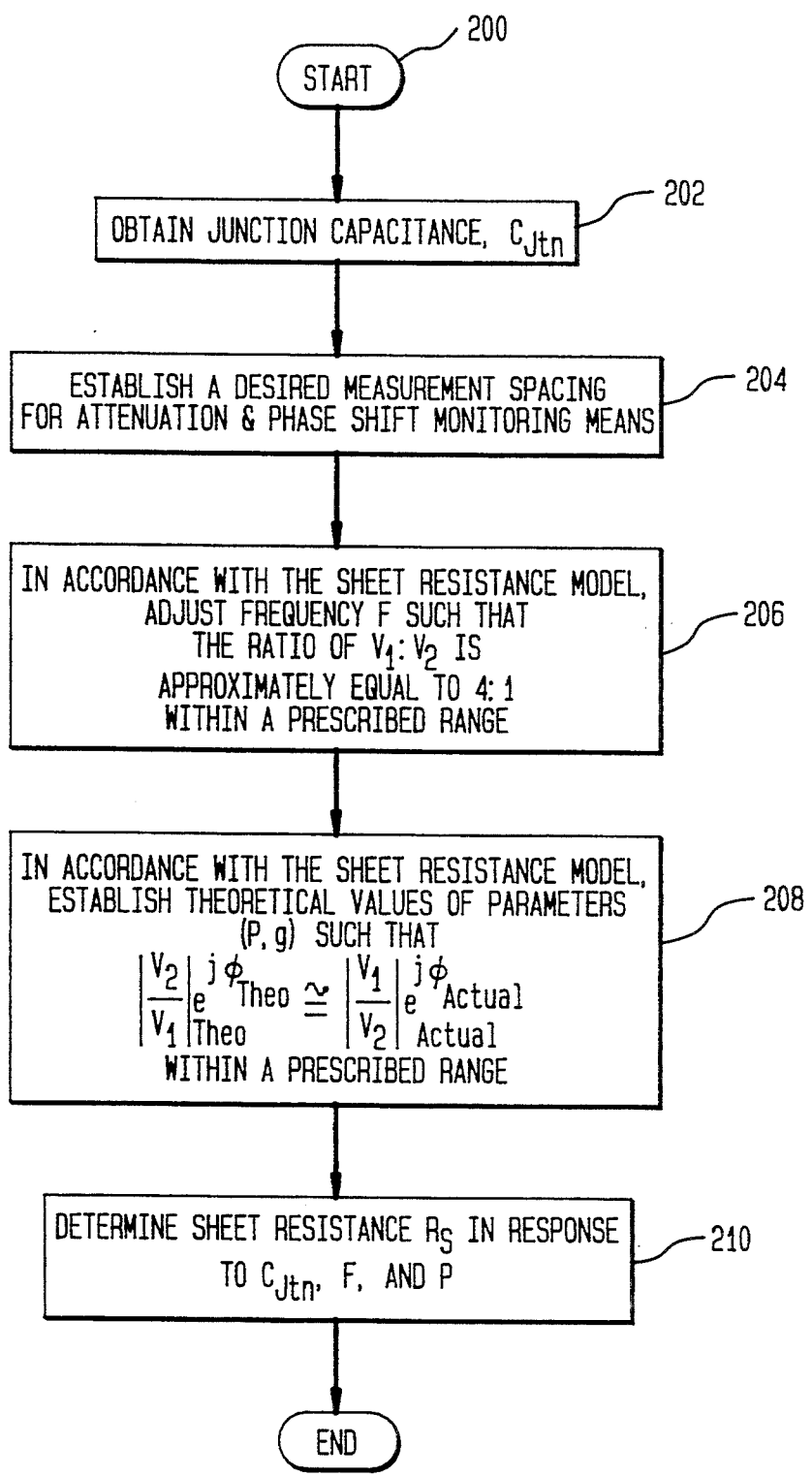
FIG. 3 is a flow diagram of the method according to the present invention.
Figure 4:
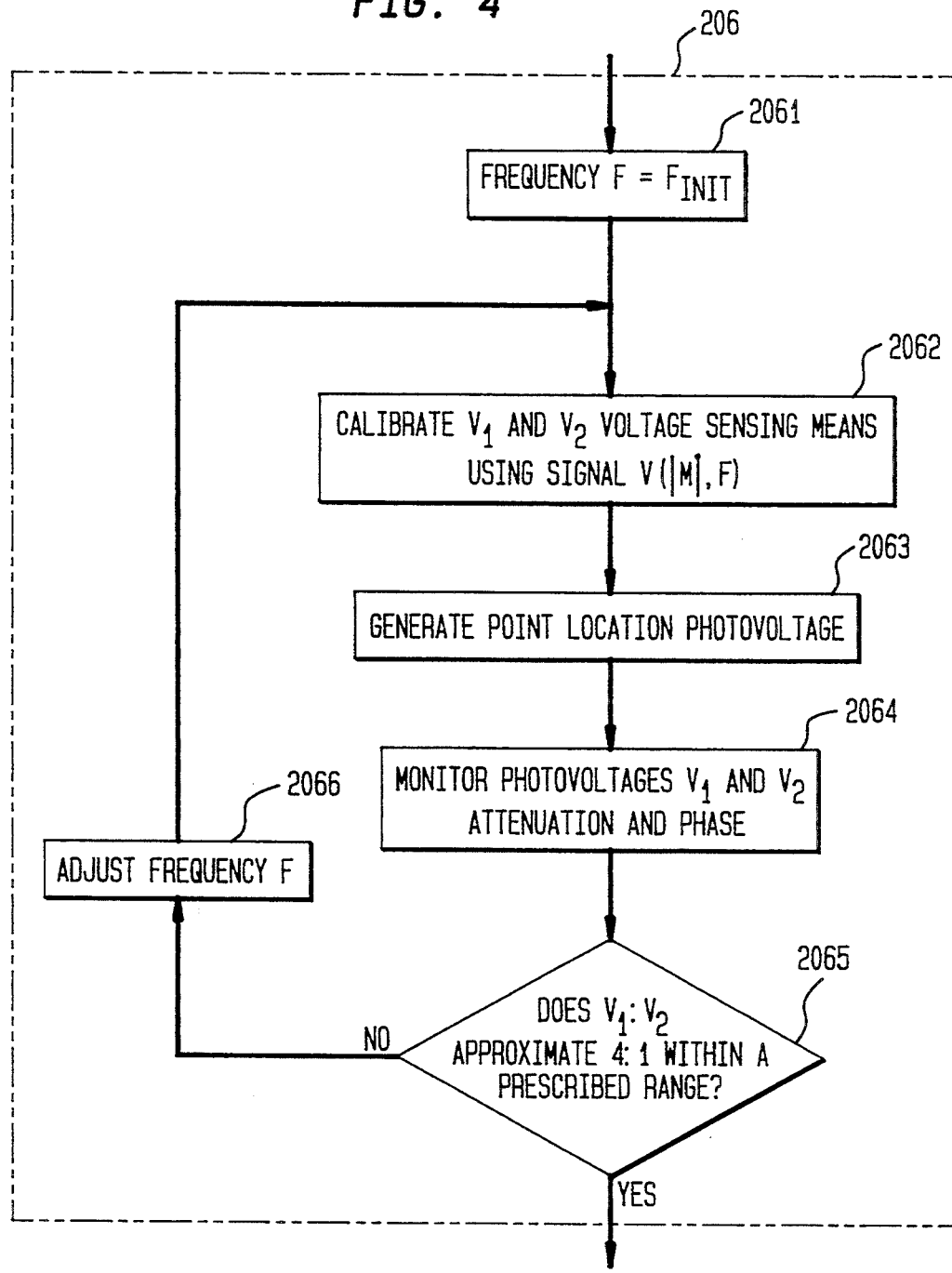
FIG. 4 is a detailed flow diagram of a portion of the flow diagram of FIG. 3.
Figure 5:
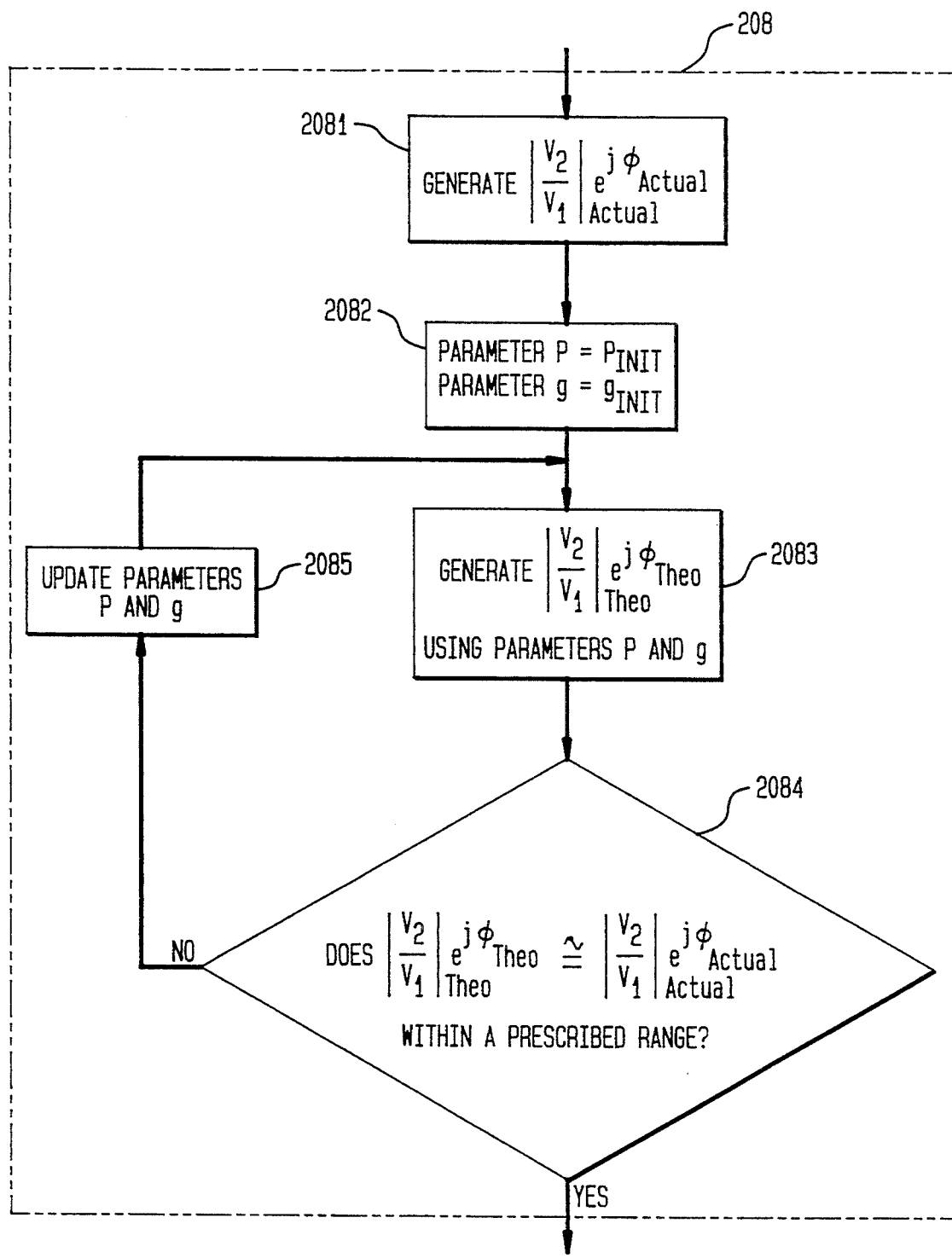
FIG. 5 is a detailed flow diagram of another portion of the flow diagram of FIG. 3.

Operation of the present invention will now further be explained with reference to the apparatus figure (FIG. 1) and flow diagrams (FIGS. 3-5). Corresponding to the beginning of a sheet resistance measurement, as indicated by Step 200 of FIG. 3, a semiconductor substrate 12 of a first conductivity type having a desired layer 10 of an opposite conductivity type thereon, is securably mounted upon wafer chuck 14 (FIG. 1). Sheet resistance of the desired layer 10 is then determined using the apparatus and method of the present invention. In step 202 of FIG. 3, an amount of junction capacitance $C_{jtn}$ is established via the junction capacitance establishing means 102. A junction capacitance signal is provided to sheet resistance signal generating means 120 via signal line 103 (FIG. 1). In the instance wherein Junction capacitance establishing means comprises a keyboard, a known junction capacitance value may simply be entered via the keyboard. In the instance wherein junction capacitance establishing means comprises a measurement device, a suitable measurement is made according to the particular requirements of the measurement device whereby the output signal representative of a measured value of junction capacitance, or some electrical characteristic proportional to junction capacitance, is provided via signal line 103 to sheet resistance signal generating means 120. Sheet resistance signal generating means 120 maintains or stores the established value of junction capacitance for subsequent use, as will be further described.

In preparation for making a sheet resistance measurement of the desired layer, a desired measurement spacing is established for the attenuation and phase shift monitoring means 108 (FIG. 1) as indicated in Step 204 (FIG. 3). In particular, signal generating means 120 (FIG. 1) provides an appropriate control signal to signal generator 162, wherein signal generator 162 provides a corresponding DC signal along line 164 to the electromagnetic forcer 152. Attenuation and phase shift monitoring means 108 then moves from a first position 151 to a second position 153, the second position 153 corresponding to a desired measurement spacing. Feedback control for the spacing is provided via the position dependent output signal provided on signal line 168 from LVDT 166.

In the next step (Step 206 of FIG. 3), modulation frequency F of signal generating means 126 is adjusted by sheet resistance signal generating means 120 (FIG. 1). Adjustment of modulation frequency F is performed to achieve the prescribed change in attenuation monitored by said attenuation and phase shift monitoring means 108 between the first and second radial distances, $r_1$ and $r_2$, respectively. Referring now to FIG. 4, in Step 2061, the modulation frequency F is set to an initial value $F_{INIT}$. In Step 2062, sheet resistance signal generating means 120 calibrates the magnitude and phase voltage signal outputs of $V_1$ and $V_2$ using signal $V(|M|,F)$. As discussed above, voltage measurement signal calibration is accomplished via sheet resistance signal generating means 120 such that, at a particular modulation frequency F, any differential variations in magnitude or phase shift between the outputs of voltage sensing means 134 and 136 may be compensated for, as appropriate. A first calibration of the magnitude and phase outputs occurs at the frequency F equal to $F_{INIT}$.

Referring still to FIG. 4, in Step 2063, sheet resistance signal generating means 120 is operative to generate a point location photovoltage. With reference now to FIG. 1, sheet resistance signal generating means 120 sends an appropriate signal on line 138 to control switching means 140 for electrically grounding substrate 12 with respect to an alternating current (AC) potential. Sheet resistance signal generating means 120 thereafter sends a signal via signal line $126_A$ for instructing signal generating means 126 to provide an AC voltage signal $V(|M|,F)$ at modulation frequency F, thereby exciting light source 124 for creating a point location AC photovoltage between the desired layer 10 and the underlying substrate 12. The frequency F is monitored via frequency counter 128 on signal line 105. The excitation light is directed to the desired layer 10 and the underlying substrate 12 via light pipe 129 at point location 106, thereby forming a localized light spot of a diameter 1250 (See FIG. 2) on a top surface of desired layer 10. A point location sinusoidal AC photovoltage is thereby created at an interface between the desired layer 10 and the underlying substrate 12, the photovoltage propagating radially outward. In other words, the photovoltage, having a sinusoidal magnitude and frequency, propagates radially outward from the point location 106 along the desired layer 10 by the resistive nature thereof. The propagation of the photovoltage is further characterized by an attenuation and phase shift.

Referring again to FIG. 4, in Step 2064, sheet resistance signal generating means 120 monitors the magnitude $|V_1|$ and phase $\beta_1$ at radius $r_1$ and the magnitude $|V_2|$ and phase $\beta_2$ at radius $r_2$, via the output signals of attenuation and phase shift monitoring means 108 (FIG. 1). That is, the attenuation and phase shift of the propagated AC photovoltage as a function of radial distance is monitored by monitoring means 108. Means 108 monitors the magnitude and phase of the photovoltage at first and second radial distances, $r_1$ and $r_2$, via capacitively coupled pick-up plates 130 and 132, respectively. Voltage signals sensed by the pick-up plates are input into voltage sensing means 134 and 136, respectively. Magnitude and phase signals, $V_1(|V_1|, \beta_1)$ and $V_2(|V_2|, \beta_2)$, are provided on respective output signal lines 112, 114 and 116, 118. The output signals 112, 114 and 116, and 118 are thus received by sheet resistance signal generating means 120.

During the monitoring of attenuation and phase shift at the first and second radial distances, an AC signal (on the order of approximately 27 Hz) is applied to electromagnet 158 via signal generator 162, as controlled by means 120 via signal line 170. The AC signal applied to electromagnet 158 results in a slight vibrating of the base member 109 and the corresponding capacitively coupled pickup plates 130 and 132. Vibrating of the attenuation and phase shift monitoring means 108 in this manner creates a Kelvin probe type measurement. Monitoring of semiconductor wafer surface voltages using Kelvin probe apparatus for Kelvin probe type measurements is well known in the art, and thus not discussed in great detail herein. With reference to the present invention, such a Kelvin probe type measurement enables the measuring a DC voltage component imposed upon the Junction formed by the desired layer 10 and the underlying substrate 12. The DC voltage component imposed upon the junction results from the application of the AC photovoltage, thereby introducing an undesirable error component into the sheet resistance measurement. Measurement of the DC voltage component enables such undesirable errors to be compensated for in an appropriate manner.

To further ensure the integrity of the voltages sensed by the capacitively coupled pick-up plates 130 and 132, and to minimize the potential for undesirable cross-coupling between the pick-up plates, grounded plates 131, 133, and 135 are provided (see FIG. 1). Grounded plates 131, 133, and 135 preferably comprise flat conductive rings of suitable dimensions affixed or mounted to base member 109 by suitable means and connected to a ground potential for effectively shielding plates 130 and 132.

Having now monitored the photovoltage attenuation and phase at first and second radial distances, we now turn once again to FIG. 4. In Step 2065, means 120 determines whether the ratio of the magnitude $|V_1|$ to magnitude $|V_2|$ is approximately 4:1 within a prescribed range. If the ratio is outside the prescribed range, means 120 adjusts the frequency F in a prescribed manner in Step 2066, and then repeats steps beginning with Step 2062. Adjustment of frequency F is made as appropriate, that is, in a prescribed manner whereby increasing F to a higher frequency decreases the radial distance in which the photovoltage attenuates to zero, and whereby decreasing F to a lower frequency increases the radial distance in which the photovoltage attenuates to zero. If the ratio of monitored $|V_1|$ to monitored $|V_2|$ is approximately 4:1 in accordance with the prescribed sheet resistance model within a prescribed range or tolerance, then adjustment of the modulation frequency F is completed for the particular desired layer 10 and underlying substrate 12. In this manner, the magnitude of $V_2/V_1$ is forced to a particular value according to the sheet resistance model. Alternatively, modulation frequency F is adjusted until the monitored voltage $|V_2|$ at radius $r_2$ is approximately one-quarter ($\frac{1}{4}$) of the monitored voltage $|V_1|$ at radius $r_1$. The adjusted frequency F, in addition to the actual monitored magnitude and phase of $V_1$ and $V_2$ (i.e., for determination of $|V_2/V_1|_{Actual}e^{j\phi Actual}$) are then used for the subsequent sheet resistance determination of the desired layer 10, as will be further explained herein below.

It should be noted that the amount of junction capacitance $C_{jtn}$ may alternatively be established via the junction capacitance establishing means 102 subsequent to the adjustment of frequency F. That is, Step 202 may be occur after Step 206.

We now turn to FIGS. 3 and 5, where in Step 208, the present invention determines theoretical values for P and g, such that the theoretical magnitude and phase of $V_2/V_1$ are substantially equal to the actual forced magnitude and measured phase of $V_2/V_1$. That is, successive approximation values of P and g, as further discussed herein below, are used to generate corresponding theoretical magnitude $|V_2/V_1|$ and phase $\phi$ values until a theoretical magnitude $|V_2/V_1|$ and phase $\phi$ value are substantially equal to the forced actual magnitude $|V_2/V_1|_{Actual}$ and phase $\phi_{Actual}$ within a prescribed range or tolerance. Criteria for establishing at what point the theoretical magnitude and phase of $V_2/V_1$ are substantially equal to the forced actual magnitude and phase of $V_2/V_1$ may be established in accordance with the desired accuracy of the sheet resistance measurement. Upon obtaining the value for P and g for which the corresponding theoretical magnitude $|V_2/V_1|$ and phase $\phi$ substantially equals the forced actual magnitude $|V_2/V_1|_{Actual}$ and phase $\phi_{Actual}$, the sheet resistance, $R_S$, of interest is then determined according to the sheet resistance model based upon characteristic parameter P, and further in view of frequency F and junction capacitance $C_{jtn}$. Recall that F is the adjusted sinusoidal modulation illumination frequency that was needed to force the desired small-signal magnitude of $V_2/V_1$ and $C_{jtn}$ is the P-N junction capacitance.

Turning now to FIG. 5, in step 2081, the forced actual magnitude $|V_2/V_1|_{Actual}$ and phase $\phi_{Actual}$ are determined by sheet resistance signal generating means 120 based upon inputs received on signal lines 112, 114 and 116, 118 at the adjusted frequency F as discussed above. That is, sheet resistance $R_S$ signal generating means 120 generates an actual magnitude $|V_1/V_2|_{Actual}$ and phase $\phi_{Actual}$ according to the prescribed sheet resistance model, wherein the sheet resistance model is based upon the propagation of the AC photovoltage as a function of radial distance remote from the point location. In Step 2082, recalling above that according to the prescribed model, the magnitude $|V_1/V_2|$ and phase $\phi$ are further a function of first and second prescribed characteristic parameters P and g, sheet resistance $R_S$ signal generating means 120 estimates the first characteristic parameter $P_{EST}$ and the second characteristic parameter $g_{EST}$. That is, the estimated first characteristic parameter $P_{EST}$ is set to an initial estimated value $P_{INIT}$ and the estimated second characteristic parameter $g_{EST}$ is set to an initial estimated value $g_{INIT}$. Furthermore, the estimated first characteristic parameter $P_{EST}$ and the estimated second characteristic parameter $g_{EST}$ are updatable in a prescribed manner, such as, according to a suitable extrapolation method or other method for approximating such parameters, to be discussed further herein below.

Referring still to FIG. 5, in Step 2083, sheet resistance signal generating means 120 generates a theoretical magnitude $|V_1/V_2|_{Theo}$ and phase $\phi_{Theo}$ according to the prescribed sheet resistance model, the estimated first characteristic parameter $P_{EST}$, and the estimated second characteristic parameter $g_{EST}$. Upon obtaining both the actual and theoretical magnitude and phases, means 120 compares the theoretical magnitude $|V_1/V_2|_{THEO}$ and phase $\phi_{THEO}$ to the actual magnitude $|V_1/V_2|_{Actual}$ and phase $\phi_{Actual}$ in Step 2084.

If a result of the comparison in Step 2084 indicates that the theoretical magnitude and phase is not substantially equal to the actual magnitude and phase within a prescribed range, means 120 iteratively updates the estimated first and second characteristic parameters $P_{EST}$ and $g_{EST}$ in Step 2085, and repeats Steps 2083 and 2084. Preferably, characteristic parameters P and g are updatable by a successive approximation method, the method determining updated values for P and g as briefly described in the following. Since the theoretical magnitude $|V_2/V_1|$ and phase $\phi$ are both functions of P and g, their relative sensitivities to P and g are used to select successive estimates for P and g. For example, if a fifteen percent (15%) change would be needed to make the theoretical value of $|V_2/V_1|$ equal to the actual value of $|V_2/V_1|$ and the theoretical value of $|V_2/V_1|$ happened to be equally sensitive to changes in P and g, then P and g would both be incremented by seven and a half percent (7.5%) (i.e., 15% divided in half). On the other hand, if the theoretical value of $|V_2/V_1|$ happened to be twice as sensitive to changes in P than to changes in g, then P would be incremented by ten percent (10%) and g would be incremented by five percent (5%). Sensitivities of the theoretical value of $|V_2/V_1|$ and phase $\phi$ to P and g for this successive approximation method are determined by the use of partial derivatives which are well known in the art.

If a result of the comparison in Step 2084 indicates the theoretical magnitude and phase to be substantially equal to the actual magnitude and phase within a prescribed range, then updating of first and second characteristic parameters P and g, respectively, is completed. Means 120 thereafter in Step 210 of FIG. 3 utilizes the most recent value of the estimated first characteristic parameter $P_{EST}$, the junction capacitance $C_{Jtn}$, and the adjusted frequency F to determine the sheet resistance $R_S$ in accordance with the prescribed sheet resistance model (i.e., in accord with the expression $P=(\pi FRC)^{\frac{1}{2}}$ cm$^{-1}$).

Thus, sheet resistance signal generating means 120 is responsive to the junction capacitance $C_{Jtn}$ signal on signal line 103, the adjusted AC sinusoidal frequency F signal on signal line 105, and the first and second attenuation and phase shift signals on signal lines 112, 114 and 116, 118 for generating an output signal indicative of a sheet resistance $R_S$ of the desired layer 10 according to the sheet resistance model, where R is the sheet resistance parameter of interest.

Figure 6:
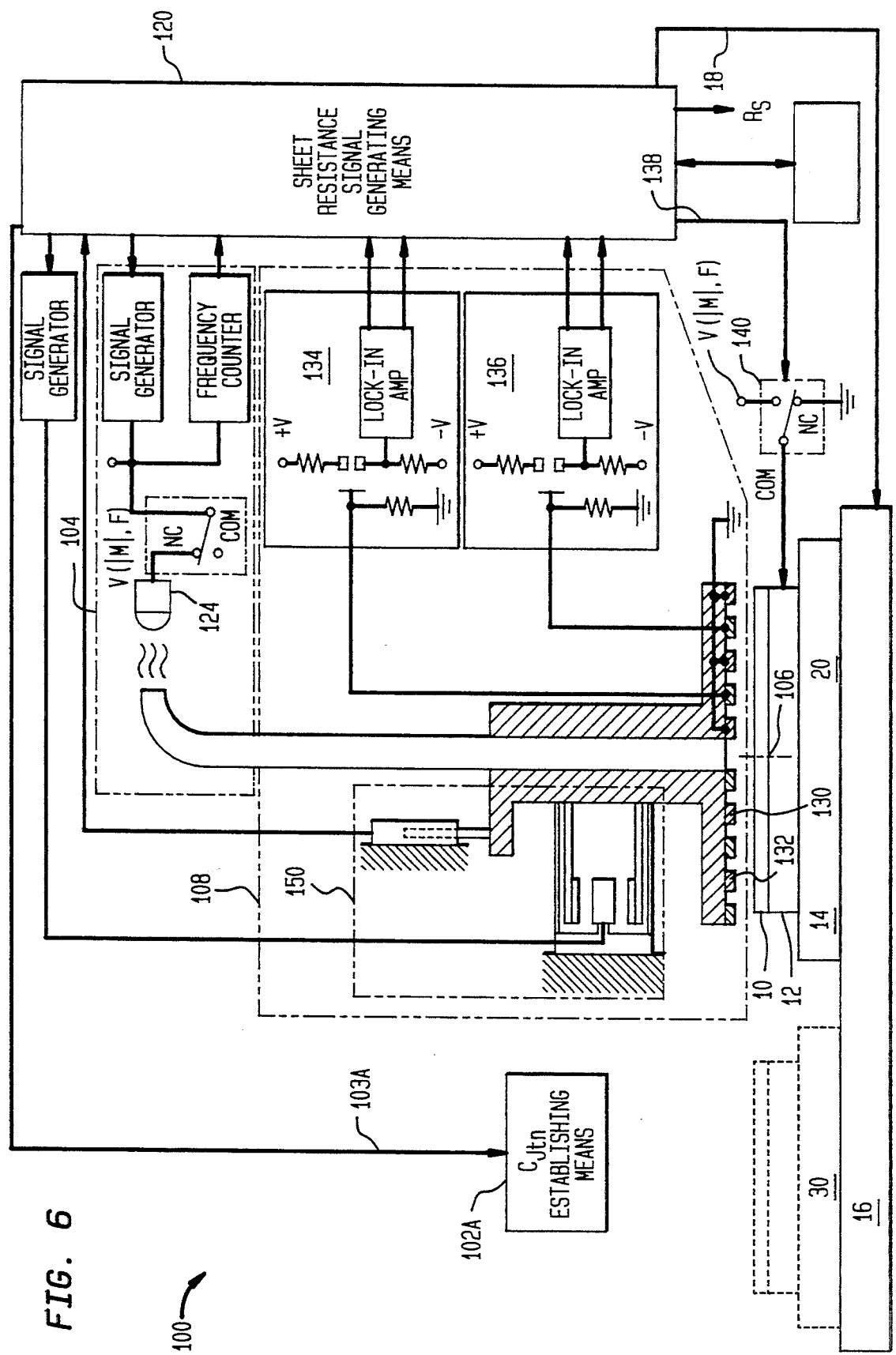
FIG. 6 shows a schematic view, with parts in section, of an alternate embodiment according to the present invention.

In an alternate embodiment as shown in FIG. 6, the invention is substantially similar to that described above with reference to FIGS. 1–5, however, with the following differences. Wafer chuck 14 is mounted upon a suitable slide track 16, utilized for transporting chuck 14 between first and second positions, indicated by numerals 10 and 20, respectively. Slide track 16 is connected to sheet resistance signal generating means 120 via control signal line 18. The first position 20 is representative of the wafer chuck 14 being in a sheet resistance measurement position and the second position 30 corresponds to a second measurement position, such as, a junction capacitance measurement position, for instance. In this later case, a junction capacitance measurement means 102A for measuring a characteristic of desired layer 10 on substrate 12 representative of junction capacitance is shown positioned above second measurement position 30. Junction capacitance measurement means 102A is connected to sheet resistance signal generating means 120 via signal line 103A. Operation of sheet resistance measurement apparatus 100 of FIG. 6 operates substantially similar to that of the preferred embodiment. Alternate measurement means may be provided at measurement position 30, for example, a four-point probe for use in comparison measurement testing or other forms of testing, wherein junction capacitance establishing means 102 could be as described with respect to the preferred embodiment as shown in FIG. 1.

There has thus been shown a contactless sheet resistance measurement apparatus and method of measuring the sheet resistance of a desired layer having a first conductivity type over an underlying substrate having an opposite conductivity type. The apparatus and method of the present invention are well suited for providing a desired highly accurate and repeatable measurement of sheet resistance $R_S$ of a desired layer. The present invention further provides a number of other advantages, relative to the conventional four point probe and metal-oxide-semiconductor (MOS) methods. For example, in contrast to the four point probe method, the screen oxide layer that is normally grown on a wafer, prior to ion implantation, does not have to be stripped, since the present invention is contactless.

This yields far more accurate $R_S$ values, due to avoiding electrical alteration of the surface of the implant layer that would otherwise occur from chemically stripping the screen oxide. Furthermore, in contrast to the MOS method, the present invention is capable of measurements above a 5E12 implant dose range and does not require the expensive, time consuming and destructive processing needed to form electrodes for capacitive-voltage testing. The ability to correct for measurement error, due to leakage of the P-N junction between the implant layer and the underlying opposite conductivity substrate, is an additional advantage over conventional four point probe methods.

While the invention has been particularly shown and described with reference to the preferred embodiment thereof, it will be understood by those skilled in the art that various changes in form and detail may be made therein without departing from the spirit and scope of the invention. For example, adjusting of the sinusoidal pulsing frequency of the light source 124 in order to force a desired $|V_2/V_1|$ ratio can be accomplished by having a local computer make successive frequency adjustments (as in the preferred embodiment) or by using an electronic servo system. For the case of a servo system, a feedback-controlled, voltage to frequency converter could automatically perform the frequency adjustment.

What is claimed is:

1. A contactless sheet resistance measurement apparatus for measuring the sheet resistance of a desired layer of a first conductivity formed upon an underlying opposite conductivity substrate, said apparatus comprising:
   a) means for establishing an amount of junction capacitance of the junction between the desired layer and the underlying substrate, said junction capacitance establishing means providing a signal indicative of the junction capacitance;
   b) means for generating a point location alternating current (AC) photovoltage between the desired layer and the underlying substrate, the photovoltage having a sinusoidal magnitude and frequency and further being propagated radially outward from a point location along the desired layer by a resistive nature of the desired layer at an attenuation and phase shift, said point location AC photovoltage generating means further providing a signal indicative of the AC sinusoidal frequency;
   c) means for monitoring the attenuation and phase shift of the propagated AC photovoltage as a function of radial distance remote from the point location, said attenuation and phase shift monitoring means providing first and second output signals indicative of a first and a second monitored magnitude and phase at first and second radial distances, respectively; and,
   d) means responsive to the junction capacitance signal, the AC sinusoidal frequency signal, and the first and second attenuation and phase shift signals for generating an output signal indicative of a sheet resistance $R_S$ of the desired layer according to a prescribed sheet resistance model.

2. The contactless sheet resistance measurement apparatus of claim 1, wherein:
   said junction capacitance establishing means comprises an input device for inputting an input representative of a known amount of junction capacitance of the junction between the desired layer and the underlying substrate.

3. The contactless sheet resistance measurement apparatus of claim 1, wherein:
said junction capacitance establishing means comprises a means for measuring an electrical characteristic of the desired layer and the underlying substrate corresponding to the amount of the junction capacitance.

4. The contactless sheet resistance measurement apparatus of claim 1, wherein:
said junction capacitance establishing means comprises a measurement device for measuring the amount of junction capacitance of the junction between the desired layer and the underlying substrate.

5. The contactless sheet resistance measurement apparatus of claim 1, wherein:
said AC point location photovoltage generating means comprises a light emitting diode, said point location AC photovoltage generating means further comprising a light pipe for directing the sinusoidal illumination of the light emitting diode to form a localized diameter light spot on a top surface of the desired layer.

6. The contactless sheet resistance measurement apparatus of claim 1, wherein:
said AC point location photovoltage generating means comprises a laser device, said point location AC photovoltage generating means further comprising a light pipe for directing the sinusoidal illumination of the laser device to form a localized diameter light spot on a top surface of the desired layer.

7. The contactless sheet resistance measurement apparatus of claim 1, wherein:
said attenuation and phase shift monitoring means comprises i) first and second capacitively coupled pick-up plates, the first and second capacitively coupled pick-up plates being concentric with the point location, and further wherein the first and second pick-up plates comprise flat rings having a first and a second effective radius, respectively, the second radius being larger than the first, and ii) means for sensing a magnitude and phase of an AC photovoltage capacitively coupled to the first and second pick-up plates, respectively, said sensing means further providing corresponding magnitude and phase output signals for each of the first and second pick-up plates, respectively.

8. The contactless sheet resistance measurement apparatus of claim 1, wherein:
said sheet resistance $R_S$ signal generating means further comprising means for: i) generating an actual magnitude and phase according to the prescribed sheet resistance model, the sheet resistance model being based upon the propagation of the AC photovoltage as a function of radial distance remote from the point location, the prescribed model further comprising first and second prescribed characteristic parameters; ii) estimating the first characteristic parameter and the second characteristic parameter, the estimated first characteristic parameter and the estimated second characteristic parameter being updatable in a prescribed manner; iii) generating a theoretical magnitude and phase according to the prescribed sheet resistance model, the estimated first characteristic parameter, and the estimated second characteristic parameter; iv) comparing the theoretical magnitude and phase to the actual magnitude and phase and, upon the theoretical magnitude and phase being outside a prescribed range of the actual magnitude and phase, iteratively updating the estimated first and second characteristic parameters and repeating iii) and iv); and v) using a most recent value of the estimated first characteristic parameter, the junction capacitance, and the frequency to determine the sheet resistance in accordance with the prescribed sheet resistance model.

9. The contactless sheet resistance measurement apparatus of claim 1, further comprising:
e) means for calibrating the frequency of the point location AC photovoltage generating means according to a particular desired layer and underlying substrate, said calibrating means adjusting the frequency to achieve a prescribed change in attenuation monitored by said attenuation and phase shift monitoring means between the first and second radial distances.

10. The contactless sheet resistance measurement apparatus of claim 9, wherein:
said junction capacitance establishing means comprises an input device for inputting an input representative of a known amount of junction capacitance of the junction between the desired layer and the underlying substrate.

11. The contactless sheet resistance measurement apparatus of claim 9, wherein:
said junction capacitance establishing means comprises a means for measuring an electrical characteristic of the desired layer and the underlying substrate corresponding to the amount of the junction capacitance.

12. The contactless sheet resistance measurement apparatus of claim 9, wherein:
said junction capacitance establishing means comprises a measurement device for measuring the amount of junction capacitance of the junction between the desired layer and the underlying substrate.

13. The contactless sheet resistance measurement apparatus of claim 9, wherein:
said AC point location photovoltage generating means comprises a light emitting diode, said point location AC photovoltage generating means further comprising a light pipe for directing the sinusoidal illumination of the light emitting diode to form a localized diameter light spot on a top surface of the desired layer.

14. The contactless sheet resistance measurement apparatus of claim 9, wherein:
said AC point location photovoltage generating means comprises a laser device, said point location AC photovoltage generating means further comprising a light pipe for directing the sinusoidal illumination of the laser device to form a localized diameter light spot on a top surface of the desired layer.

15. The contactless sheet resistance measurement apparatus of claim 9, wherein:
said attenuation and phase shift monitoring means comprises i) first and second capacitively coupled pick-up plates, the first and second capacitively coupled pick-up plates being concentric with the point location, and further wherein the first and second pick-up plates comprise flat rings having a first and a second effective radius, respectively, the second radius being larger than the first, and ii) means for sensing a magnitude and phase of an AC photovoltage capacitively coupled to the first and second pick-up plates, respectively, said sensing means further providing corresponding magnitude and phase output signals for each of the first and second pick-up plates, respectively.

16. The contactless sheet resistance measurement apparatus of claim 9, wherein:
said sheet resistance $R_S$ signal generating means further comprising means for: i) generating an actual magnitude and phase according to the prescribed sheet resistance model, the sheet resistance model being based upon the propagation of the AC photovoltage as a function of radial distance remote from the point location, the prescribed model further comprising first and second prescribed characteristic parameters; ii) estimating the first characteristic parameter and the second characteristic parameter, the estimated first characteristic parameter and the estimated second characteristic parameter being updatable in a prescribed manner; ill) generating a theoretical magnitude and phase according to the prescribed sheet resistance model, the estimated first characteristic parameter, and the estimated second characteristic parameter; iv) comparing the theoretical magnitude and phase to the actual magnitude and phase and, upon the theoretical magnitude and phase being outside a prescribed range of the actual magnitude and phase, iteratively updating the estimated first and second characteristic parameters and repeating iii) and iv); and v) using a most recent value of the estimated first characteristic parameter, the junction capacitance, and the frequency to determine the sheet resistance in accordance with the prescribed sheet resistance model.

17. A contactless sheet resistance measurement apparatus for measuring the sheet resistance of a desired layer of a first conductivity formed upon an underlying opposite conductivity substrate, said apparatus comprising:
a) means for establishing an amount of junction capacitance of the junction between the desired layer and the underlying substrate, said junction capacitance establishing means providing a signal indicative of the junction capacitance;
b) means for generating a point location alternating current (AC) photovoltage between the desired layer and the underlying substrate, the photovoltage having a sinusoidal magnitude and frequency and further being propagated radially outward from a point location along the desired layer by a resistive nature of the desired layer at an attenuation and phase shift, said point location AC photovoltage generating means further providing a signal indicative of the AC sinusoidal frequency;
c) means for monitoring the attenuation and phase shift of the propagated AC photovoltage as a function of radial distance remote from the point location, said attenuation and phase shift monitoring means providing first and second output signals indicative of a first and a second monitored magnitude and phase at first and second radial distances, respectively;
d) means for positioning said attenuation and phase shift monitoring means between a first position and a second position, the second position corresponding to a measurement position; and
e) means responsive to the junction capacitance signal, the AC sinusoidal frequency signal, and the first and second attenuation and phase shift signals for generating an output signal indicative of a sheet resistance $R_S$ of the desired layer according to a prescribed sheet resistance model.

18. The contactless sheet resistance measurement apparatus of claim 17, wherein:
said positioning means is responsive to a prescribed change in a calibration attenuation and phase shift for establishing a desired air gap corresponding to the measurement position.

19. A contactless sheet resistance measurement method for measuring the sheet resistance of a desired layer of a first conductivity formed upon an underlying opposite conductivity substrate, said method comprising the steps of:
a) establishing an amount of junction capacitance of a junction between the desired layer and the underlying substrate and providing a signal indicative of the junction capacitance;
b) generating a point location alternating current (AC) photovoltage between the desired layer and the underlying substrate, the photovoltage having a sinusoidal magnitude and frequency and further being propagated radially outward from a point location along the desired layer by a resistive nature of the desired layer at an attenuation and phase shift, and providing a signal indicative of the AC sinusoidal frequency;
c) monitoring the attenuation and phase shift of the propagated AC photovoltage as a function of radial distance remote from the point location, and providing first and second output signals indicative of a first and a second monitored magnitude and phase at first and second radial distances, respectively; and,
d) providing a means responsive to the junction capacitance signal, the AC sinusoidal frequency signal, and the first and second attenuation and phase shift signals for generating an output signal indicative of a sheet resistance $R_S$ of the desired layer according to a prescribed sheet resistance model.

20. The contactless sheet resistance measurement method of claim 19, wherein:
establishing the junction capacitance comprises inputting an input amount representative of a known amount of junction capacitance of the junction between the desired layer and the underlying substrate.

21. The contactless sheet resistance measurement method of claim 19, wherein:
establishing the junction capacitance comprises providing a means for measuring an electrical characteristic of the desired layer and the underlying substrate corresponding to the amount of the Junction capacitance.

22. The contactless sheet resistance measurement method of claim 19, wherein:
establishing the junction capacitance comprises providing a measurement device for measuring the amount of junction capacitance of the junction between the desired layer and the underlying substrate.

23. The contactless sheet resistance measurement method of claim 19, wherein:

generating the AC point location photovoltage comprises providing a light emitting diode, said step of generating the AC point location photovoltage further comprises providing a light pipe for directing the sinusoidal illumination of the light emitting diode to form a localized diameter light spot on a top surface of the desired layer.

24. The contactless sheet resistance measurement method of claim 19, wherein:
generating the AC point location photovoltage comprises providing a laser device, said step of generating the AC point location photovoltage further comprises providing a light pipe for directing the sinusoidal illumination of the laser device to form a localized diameter light spot on a top surface of the desired layer.

25. The contactless sheet resistance measurement method of claim 19, wherein:
monitoring the attenuation and phase shift comprises providing i) first and second capacitively coupled pick-up plates, the first and second capacitively coupled pick-up plates being concentric with the point location, and further wherein the first and second pick-up plates comprise flat rings having a first and a second effective radius, respectively, the second radius being larger than the first, and ii) a means for sensing a magnitude and phase of an AC photovoltage capacitively coupled to the first and second pick-up plates, respectively, said sensing means further providing corresponding magnitude and phase output signals for each of the first and second pick-up plates, respectively.

26. The contactless sheet resistance measurement method of claim 19, wherein:
providing a means for generating the sheet resistance $R_S$ signal further comprises the steps of: i) generating an actual magnitude and phase according to a prescribed sheet resistance model, the sheet resistance model based upon the propagation of the AC photovoltage as a function of radial distance remote from the point location, the prescribed model further comprising first and second prescribed characteristic parameters; ii) estimating the first characteristic parameter and the second characteristic parameter, the estimated first characteristic parameter and the estimated second characteristic parameter being updatable in a prescribed manner; iii) generating a theoretical magnitude and phase according to the prescribed sheet resistance model, the estimated first characteristic parameter, and the estimated second characteristic parameter; iv) comparing the theoretical magnitude and phase to the actual magnitude and phase and, upon the theoretical magnitude and phase being outside a prescribed range of the actual magnitude and phase, iteratively updating the estimated first and second characteristic parameters and repeating iii) and iv); and v) using a most recent value of the estimated first characteristic parameter, the Junction capacitance, and the frequency to determine the sheet resistance in accordance with the prescribed sheet resistance model.

27. The contactless sheet resistance measurement method of claim 19, further comprising the step of:
e) calibrating a frequency of the point location AC photovoltage generating means according to a particular desired layer and underlying substrate, said calibrating step adjusting the frequency to achieve a prescribed change in attenuation monitored by said attenuation and phase shift monitoring means between the first and second radial distances.

28. The contactless sheet resistance measurement method of claim 27, wherein:
establishing the junction capacitance comprises inputing an input amount representative of a known amount of junction capacitance of the junction between the desired layer and the underlying substrate.

29. The contactless sheet resistance measurement method of claim 27, wherein:
establishing the junction capacitance comprises providing a means for measuring an electrical characteristic of the desired layer and the underlying substrate corresponding to the amount of the junction capacitance.

30. The contactless sheet resistance measurement method of claim 27, wherein:
establishing the junction capacitance comprises providing a measurement device for measuring the amount of junction capacitance of the junction between the desired layer and the underlying substrate.

31. The contactless sheet resistance measurement method of claim 27, wherein:
generating the AC point location photovoltage comprises providing a light emitting diode, said step of generating the AC point location photovoltage further comprises providing a light pipe for directing the sinusoidal illumination of the light emitting diode to form a localized diameter light spot on a top surface of the desired layer.

32. The contactless sheet resistance measurement method of claim 27, wherein:
generating the AC point location photovoltage comprises providing a laser device, said step of generating the AC point location photovoltage further comprises providing a light pipe for directing the sinusoidal illumination of the laser device to form a localized diameter light spot on a top surface of the desired layer.

33. The contactless sheet resistance measurement method of claim 27, wherein:
monitoring the attenuation and phase shift comprises providing i) first and second capacitively coupled pick-up plates, the first and second capacitively coupled pick-up plates being concentric with the point location, and further wherein the first and second pick-up plates comprise flat rings having a first and a second effective radius, respectively, the second radius being larger than the first, and ii) a means for sensing a magnitude and phase of an AC photovoltage capacitively coupled to the first and second pick-up plates, respectively, said sensing means further providing corresponding magnitude and phase output signals for each of the first and second pick-up plates, respectively.

34. The contactless sheet resistance measurement method of claim 27, wherein:
providing a means for generating the sheet resistance $R_S$ signal further comprises the steps of: i) generating an actual magnitude and phase according to a prescribed sheet resistance model, the sheet resistance model based upon the propagation of the AC photovoltage as a function of radial distance remote from the point location, the prescribed model further comprising first and second prescribed characteristic parameters; ii) estimating the first characteristic parameter and the second characteristic parameter, the estimated first characteristic parameter and the estimated second characteristic parameter being updatable in a prescribed manner; iii) generating a theoretical magnitude and phase according to the prescribed sheet resistance model, the estimated first characteristic parameter, and the estimated second characteristic parameter; iv) comparing the theoretical magnitude and phase to the actual magnitude and phase and, upon the theoretical magnitude and phase being outside a prescribed range of the actual magnitude and phase, iteratively updating the estimated first and second characteristic parameters and repeating iii) and iv); and v) using a most recent value of the estimated first characteristic parameter, the junction capacitance, and the frequency to determine the sheet resistance in accordance with the prescribed sheet resistance model.

35. A contactless sheet resistance measurement method for measuring the sheet resistance of a desired layer of a first conductivity formed upon an underlying opposite conductivity substrate, said method comprising the steps of:
a) establishing an amount of junction capacitance of the junction between the desired layer and the underlying substrate and providing a signal indicative of the junction capacitance;
b) generating a point location alternating current (AC) photovoltage between the desired layer and the underlying substrate, the photovoltage having a sinusoidal magnitude and frequency and further being propagated radially outward from a point location along the desired layer by a resistive nature of the desired layer at an attenuation and phase shift, and providing a signal indicative of the AC sinusoidal frequency;
c) monitoring the attenuation and phase shift of the propagated AC photovoltage as a function of radial distance remote from the point location, and providing first and second output signals indicative of a first and a second monitored magnitude and phase at first and second radial distances, respectively;
d) positioning said attenuation and phase shift monitoring means between a first position and a second position, the second position corresponding to a measurement position; and,
e) providing a means responsive to the junction capacitance signal, the AC sinusoidal frequency signal, and the first and second attenuation and phase shift signals for generating an output signal indicative of a sheet resistance $R_S$ of the desired layer according to a prescribed sheet resistance model.

36. The contactless sheet resistance measurement method of claim 35, wherein:
said positioning step is responsive to a prescribed change in a calibration attenuation and phase shift for establishing a desired air gap corresponding to the measurement position.

* * * * *

UNITED STATES PATENT AND TRADEMARK OFFICE
CERTIFICATE OF CORRECTION

PATENT NO. : 5,442,297
DATED : August 15, 1995
INVENTOR(S) : Roger L. Verkuil

It is certified that error appears in the above-indentified patent and that said Letters Patent is hereby corrected as shown below:

In Column 8, line 2, after "ing means," please delete "100"

and insert -- 120 --.

Signed and Sealed this

Second Day of January, 1996

Attest:

BRUCE LEHMAN

*Attesting Officer*      Commissioner of Patents and Trademarks